US008710354B2

(12) United States Patent
Mihaila et al.

(10) Patent No.: US 8,710,354 B2
(45) Date of Patent: Apr. 29, 2014

(54) SOLAR CELL WITH HYPERPOLARIZABLE ABSORBER

(75) Inventors: Mihai N. Mihaila, Bucharest (RO); Bogdan Catalin Serban, Bucharest (RO); Viorel Georgel Dumitru, Prahova (RO); Mircea Bercu, Buharest (RO); Cazimir Bostan, Bucharest (RO); Stephan Dan Costea, Bucharest (RO)

(73) Assignee: Honeywell International Inc., Morristown, NJ (US)

( * ) Notice: Subject to any disclaimer, the term of this patent is extended or adjusted under 35 U.S.C. 154(b) by 968 days.

(21) Appl. No.: 12/337,070

(22) Filed: Dec. 17, 2008

(65) Prior Publication Data

US 2009/0159124 A1    Jun. 25, 2009

Related U.S. Application Data

(60) Provisional application No. 61/014,908, filed on Dec. 19, 2007.

(51) Int. Cl.
    *H01L 31/00* (2006.01)
    *H01L 31/042* (2006.01)
    *H01L 35/30* (2006.01)
    *C07C 245/00* (2006.01)

(52) U.S. Cl.
    USPC ........... 136/252; 136/206; 136/244; 136/255; 136/256; 136/293; 534/573

(58) Field of Classification Search
    USPC ................. 136/256, 255, 244, 206, 293, 252; 534/573
    See application file for complete search history.

(56) References Cited

U.S. PATENT DOCUMENTS

| | | | |
|---|---|---|---|
| 4,427,749 A | 1/1984 | Graetzel et al. | |
| 4,927,721 A | 5/1990 | Gratzel et al. | |
| 5,677,545 A | 10/1997 | Shi et al. | |
| 6,278,056 B1 | 8/2001 | Sugihara et al. | |
| 6,566,595 B2 | 5/2003 | Suzuki | |
| 6,861,722 B2 | 3/2005 | Graetzel et al. | |
| 6,919,119 B2 | 7/2005 | Kalkan et al. | |
| 6,936,143 B1 | 8/2005 | Graetzel et al. | |
| 7,032,209 B2 | 4/2006 | Kobayashi | |
| 7,042,029 B2 | 5/2006 | Graetzel et al. | |
| 7,091,136 B2 | 8/2006 | Basol | |
| 7,202,412 B2 | 4/2007 | Yamanaka et al. | |
| 7,202,943 B2 | 4/2007 | Chang et al. | |
| 7,462,774 B2 * | 12/2008 | Roscheisen et al. | 136/256 |
| 7,563,507 B2 | 7/2009 | Emrick et al. | |
| 7,655,860 B2 | 2/2010 | Parsons | |
| 2005/0028862 A1 | 2/2005 | Miteva et al. | |
| 2006/0021647 A1 | 2/2006 | Gui et al. | |
| 2006/0169971 A1 | 8/2006 | Cho et al. | |
| 2006/0180199 A1 * | 8/2006 | Lenhard et al. | 136/263 |
| 2006/0263908 A1 | 11/2006 | Hirai | |
| 2007/0025139 A1 | 2/2007 | Parsons | |
| 2007/0028959 A1 | 2/2007 | Lee et al. | |
| 2007/0062576 A1 | 3/2007 | Duerr et al. | |
| 2007/0119048 A1 | 5/2007 | Li et al. | |
| 2007/0120177 A1 | 5/2007 | McGregor et al. | |
| 2007/0122927 A1 | 5/2007 | Li et al. | |
| 2007/0123690 A1 | 5/2007 | Parham et al. | |
| 2007/0243718 A1 | 10/2007 | Shiratori et al. | |
| 2008/0110494 A1 | 5/2008 | Reddy | |
| 2008/0264479 A1 | 10/2008 | Harris et al. | |
| 2009/0114273 A1 | 5/2009 | Kamat | |
| 2009/0159120 A1 | 6/2009 | Wang et al. | |
| 2009/0159131 A1 | 6/2009 | Zheng et al. | |
| 2009/0159999 A1 | 6/2009 | Zheng et al. | |
| 2009/0211634 A1 | 8/2009 | Serban et al. | |
| 2009/0260682 A1 | 10/2009 | Serban et al. | |
| 2009/0260683 A1 | 10/2009 | Serban et al. | |
| 2009/0283142 A1 | 11/2009 | Serban et al. | |
| 2009/0308442 A1 | 12/2009 | Liu | |
| 2010/0006148 A1 | 1/2010 | Zheng et al. | |

(Continued)

FOREIGN PATENT DOCUMENTS

| | | |
|---|---|---|
| EP | 1473745 | 11/2004 |
| EP | 1689018 | 8/2006 |

(Continued)

OTHER PUBLICATIONS

Diguna et al., "High Efficiency of CdSe Quantum-Dot-Sensitized TiO2 Inverse Opal Solar Cells," Applied Physics Letters, vol. 91, No. 023116, 3 pages, 2007.
Chang et al., "Chemical Bath Deposition of CdS Quantum Dots Onto Mesoscopic $TiO_2$ Films for Application in Quantum-Dot-Sensitized Solar Cells," Applied Physics Letters, vol. 91, 3 pages, 2007.
U.S. Appl. No. 12/542,474, filed Aug. 17, 2009.
U.S. Appl. No. 12/433,560, filed Apr. 30, 2009.
U.S. Appl. No. 12/423,581, filed Apr. 14, 2009.
U.S. Appl. No. 12/484,034, filed Jun. 12, 2009.
U.S. Appl. No. 12/468,755, filed May 19, 2009.
U.S. Appl. No. 12/814,878, filed Jun. 14, 2010.
U.S. Appl. No. 12/614,054, filed Nov. 6, 2009.
U.S. Appl. No. 12/636,402, filed Dec. 11, 2009.
U.S. Appl. No. 12/643,829, filed Dec. 21, 2009.
U.S. Appl. No. 12/649,155, filed Dec. 29, 2009.
U.S. Appl. No. 12/690,777, filed Jan. 20, 2010.
U.S. Appl. No. 12/849,719, filed Aug. 3, 2010.

(Continued)

*Primary Examiner* — Ling-Siu Choi
*Assistant Examiner* — Monique Peets
(74) *Attorney, Agent, or Firm* — Seager Tufte & Wickhem LLC.

(57) ABSTRACT

A solar cell may include a light sensitive molecule such as a hyperpolarizable molecule. In one example, a solar cell may include a layer of hyperpolarizable molecules disposed between a p-type electrode and an n-type electrode. In some cases, at least some of the hyperpolarizable molecules may include an electron donating group that is bonded or otherwise linked to the n-type electrode as well as an electron accepting group that is bonded or otherwise linked to the p-type electrode. In some instances, at least some of the hyperpolarizable molecules may include an electron donating group that is bonded or otherwise linked to the p-type electrode as well as an electron accepting group that is bonded or otherwise linked to the n-type electrode.

5 Claims, 2 Drawing Sheets

(56) References Cited

U.S. PATENT DOCUMENTS

| | | | |
|---|---|---|---|
| 2010/0012168 A1 | 1/2010 | Mihaila et al. | |
| 2010/0012191 A1 | 1/2010 | Serban et al. | |
| 2010/0043874 A1 | 2/2010 | Liu | |
| 2010/0116326 A1 | 5/2010 | Gur et al. | |
| 2010/0193025 A1 | 8/2010 | Serban et al. | |
| 2010/0193026 A1 | 8/2010 | Serban et al. | |
| 2010/0326499 A1 | 12/2010 | Liu | |

FOREIGN PATENT DOCUMENTS

| | | |
|---|---|---|
| EP | 1936644 | 6/2008 |
| JP | 2008177099 | 7/2008 |
| WO | WO 2004/017345 | 2/2004 |
| WO | WO 2006/073562 | 7/2006 |
| WO | WO 2006/099386 | 9/2006 |
| WO | WO 2006/119305 | 11/2006 |
| WO | WO 2007/098378 | 8/2007 |
| WO | WO 2007/100600 | 9/2007 |

OTHER PUBLICATIONS

Hodes, "Chemical Solution Deposition of Semiconductor Films," Marcel Dekker Inc., 381 pages, 2002.

Lin et al., "Quantum-Dot-Sensitized Solar Cells: Assembly of CdS-Quantum-Dots Coupling Techniques of Self-Assembled Monolayer and Chemical Bath Deposition," Applied Physics Letters, vol. 90, 3 pages, 2007.

Afzal, "Studies of Cephradine Metal Interactions," 342 pages, Oct. 1998.

Anacona et al., "Synthesis and Antibacterial Activity of Cefotaxime Metal Complexes," Journal of the Chilean Chemical Society, vol. 50, No. 2, 7 pages, Jun. 2005.

Anacona et al., "Synthesis and Antibacterial Activity of Cefoxitin Metal Complexes," Transition Metal Chemistry, vol. 30, pp. 605-609, 2005.

Asbury et al., "Ultrafast Electron Transfer Dynamics from Molecular Adsorbates to Semiconductor Nanocrystalline Thin Films," Journal of Physical Chemistry B., vol. 105, No. 20, pp. 4545-4557, 2001.

Costa-Bizzarri et al., "Poly[3-Hexyl-4-(6-Bromohexyl)thiophene]: a Key-Intermediate for the Synthesis of Self-Plastifying, Multifunctional Polythiophenes," Polymer, vol. 45, pp. 8629-8637, 2004.

Diol et al., "Electron Transfer Dynamics at GaAs Surface Quantum Wells," Journal of Physical Chemistry B, vol. 102, pp. 6193-6201, 1998.

El-Maali et al., "Voltammetric Analysis of Cu (II), Cd (II) and Zn (II) Complexes and their Cyclic Voltammetry with Several Cephalsoporin Antibiotics," Bioelectrochemistry, vol. 65, pp. 95-104, 2005.

Enescu, Medicamente, pp. 292-293, 2005.

Enright et al., "Spectroscopic Determination of Electron and Hole Effective Masses in a Nanocrystalline Semiconductor Film," Journal of Physical Chemistry vol. 100, No. 3, pp. 1027-1035, 1996.

Galoppini, "Linkers for Anchoring Sesitizers to Semiconductor Nanoparticles," Coordination Chemistry Reviews vol. 248, pp. 1283-1297, 2004.

Gautam et al., "Soft Chemical Routes to Semiconductor Nanostructures," Pramana Journal of Physics, vol. 65, No. 4, pp. 549-564, Oct. 2005.

Gregg, "Excitonic Solar Cells," Journal of Physical Chemistry B., vol. 107, pp. 4688-4698, No. 20, May 1, 2003.

Hara et al., "Effect of Additives on the Photovoltaic Performance of Coumarin-Dye-Sensitized Nanocrystalline $TiO_2$ Solar Cells," Langmuir, vol. 20, No. 10, pp. 4205-4210, 2004.

http://en.wikipedia.org/wiki/Quantum_dot_solar_cell, "Nanocrystal Solar Cell," 1 page, printed Oct. 17, 2007.

http://findarticles.com/articles/mi_qa3776/is_200605ai_n17176721/print, "Ultradense GaN Nanopillar and Nanopore Arrays by Self-Assembly Nanopatterning," 4 pages, May 5, 2008.

http://www.evidenttech.com, Evident Technologies Webpages, 11 pages, printed Oct. 17, 2007.

http://www.i-sis.org.uk/QDAUESC.php, "Quantum Dots and Ultra-Efficient Solar Cells?" ISIS Press Release, Jan. 19, 2006.

Hwang et al., "A Highly Efficient Organic Sensitizer for Dye-Sensitized Solar Cells," Chemical Communications, 5 pages, printed Sep. 27, 2007.

ISBN No. 7-04-009141-0, 8 pages, 2001, 2003.

ISBN No. 978-7-03-015873-4, 8 pages, 2005.

Kay et al., "Artificial Photosynthesis. 1. Photosensitization of $TiO_2$ Solar Cells with Chlorophyll Derivatives and Related Natural Porphyrins," Journal of Physical Chemistry, vol. 97, No. 23, pp. 6272-6277, 1993.

Kim et al., "Enhanced Photocatalytic Activity in Composites of $TiO_2$ Nanotubes and Cds Nanoparticles," Chem. Commun., pp. 5024-5026, 2006.

Klimov, "Spectral and Dynamical Properties of Multiexcitons in Semiconductor Nanocrystals," ANRV, vol. 308-PC58-24, pp. 635-673, Dec. 2, 2006.

Kouklin et al., "Ultradense GaN Nanopillar and Nanopore Arrays by Self-Assembly and Nanopatterning," Journal of Electronic Materials, vol. 35, No. 5, pp. 1133-1137, May 2006.

Kuzyk, "Erratum: Physical Limits on Electronic Nonlinear Molecular Susceptibilities," Physical Review Letters, vol. 90, No. 3, 1 page, Jan. 2003.

Kuzyk, "Fundamental Limits on Third-Order Molecular Susceptibilities," Optics Letters, vol. 25, No. 16, pp. 1183-1185, Aug. 15, 2000.

Kuzyk, "Physical Limits on Electronic Nonlinear Molecular Susceptibilities," Physical Review Letters, vol. 85, No. 6, pp. 1218-1221, Aug. 7, 2000.

Lee et al., "CdSe Quantum Dot-Sensitized Solar Cells Exceeding Efficiency 1% at Full-Sun Intensity," Journal of Physical Chemistry C, vol. 112, No. 30, pp. 11600-11608, Jul. 4, 2008.

Lee et al., "Fabrication of Aligned $TiO_2$ One-Dimensional Nanostructured Arrays Using a One-Step Templating Solution Approach," The Journal of Physical Chemistry Letters B, vol. 109, No. 27, pp. 13056-13059, Jun. 2005.

Li et al., "Band-Structure-Corrected Local Density Approximation Study of Semiconductor Quantum Dots and Wires," Physical Review B., vol. 72, 15 pages, 2005.

Li et al., "Conducting Polythiophenes with a Broad Spectrum of Reactive Groups," Journal of Polymer Science A, Polymer Chemistry, vol. 43, pp. 4547-4558, 2005.

Li et al., "Review of Recent Progress in Solid-State Dye-Sensitized Solar Cells," Solar Energy Materials and Solar Cells, vol. 90, pp. 549-573, 2006.

Liang et al., "Calculation of the Vibrationally Non-Relaxed Photo-Induced Electron Transfer Rate Constant in Dye-Sensitized Solar Cells," Physical Chemistry Chemical Physics, vol. 9, pp. 853-861, 2007.

Marcus et al, "Electron Transfers in Chemistry and Biology," Biochimica et Biophysica Acta, vol. 811, pp. 265-322, 1985.

Marcus et al., "Electron Transfer Reactions in Chemistry, Theory and Experiment," Reviews of Modern Physics, vol. 65, No. 3, pp. 599-610, Jul. 1993.

Marcus, "Electrostatic Free Energy and Other Properties of States Having Nonequilibrium Polarization. I," The Journal of Chemical Physics, vol. 24, No. 5, 11 pages, May 1956.

Marcus, "On the Theory of Oxidation-Reduction Reactions Involving Electron Transfer. I," The Journal of Chemical Physics, vol. 24, No. 5, 13 pages, May 1956.

Meier et al., "Fast Electron Transfer Across Semiconductor-Molecule Interfaces: $GaAs/Co(Cp)_2$," Journal of Physical Chemistry B., vol. 103, pp. 2122-2141, 1999.

Milliron et al., "Electroactive Surfactant Designed to Mediate Electron Transfer Between CdSe Nanocrystals and Organic Semiconductors," Advanced Materials, vol. 15, No. 1, pp. 58-61, Jan. 3, 2003.

Morrison et al., Organic Chemistry, Sixth Edition, Chapter 6, pp. 240-242, 1992.

Neale et al., "Effect of a Coadsorbent on the Performance of Dye-Sensitized $TiO_2$ Solar Cells: Shielding Versus Band-Edge Movement," Journal of Physical Chemistry B., vol. 109, No. 49, pp. 23183-23189, 2005.

Nenitescu, Chimie Organica, vol. I, p. 522, 1980.

(56) References Cited

OTHER PUBLICATIONS

Nenitescu, Chimie Organica, vol. II, p. 581, 1980.
Nilsing et al., "Phosphonic Acid Adsorption at the $TiO_2$ Anatase (101) Surface Investigated by Periodic Hybrid HF-DFT Computations," Surface Science, vol. 582, pp. 49-60, 2005.
Nozick et al., "Quantum Dot Solar Cells," Physica E, vol. 14, pp. 115-120, 2002.
O'Reagan et al., "A Low-Cost, High Efficiency Solar Cell Based on Dye-Sensitized Colloidal $TiO_2$ Films," Nature, vol. 353, pp. 737-740, Oct. 24, 1991.
Oyaizu et al., "Linear Ladder-Type Conjugated Polymers Composed of Fused Thiophene Ring Systems," Macromolecules, vol. 37, No. 4, pp. 1257-1270, 2004.
Palomares et al., "Control of Charge Recombination Dynamics in Dye Sensitized Solar Cells by the Use of Conformally Deposited Metal Oxide Blocking Layers," Journal of the American Chemical Society, vol. 125, No. 2, pp. 475-482, 2003.
Perez-Moreno et al., "Modulated Conjugation as a Means for Attaining a Record High Intrinsic Hyperpolarizability," Optics Letters, vol. 32, No. 1, pp. 59-61, Jan. 1, 2007.
Pomerantz et al., "Synthesis and Properties of Poly[3-(w-bromoalkyl)thiophene]," Synthetic Metals, vol. 101, 1 page, 1999.
Pomerantz et al., "Sysnthesis and Study of Poly(3-hexylthiophenes) and Poly(3-dodecylthiophenes) Containing Halogen and Sulfer Substitutes in the W-Position of the Side Chain," ARKIVOC, pp. 119-137, 2003.
Qian et al., "Gallium Nitride-Based Nanowire Radial Heterostructures for Nanophotonics," NanoLetters, vol. 4, No. 10, pp. 1975-1979, 2004.
Qiu et al., "Fabrication of $TiO_2$ Nanotube Film by Well-Aligned ZnO Nanorod Array Film and Sol-Gel Process," Thin Solid Films, vol. 515, pp. 2897-2902, 2007.
Robel et al., "Quantum Dot Solar Cells, Harvesting Light Energy with CdSe Nanocrystals Molecularly Linked to Mesoscopic $TiO_2$ Films," Journal of the American Chemical Society, vol. 128, No. 7, pp. 2385-2393, 2006.
Robel et al., "Size-Dependent Electron Injection from Excited CdSeQuantum Dots into $TiO_2$ Nanoparticles," JACS Communications, 2 pages, Mar. 21, 2007.
Wang et al. "Enhance the Performance of Dye-Sensitized Solar Cells by Co-grafting Amphiphilic Sensitizer and Hexadecylmalonic Acid on $TiO_2$ Nanocrystals," Journal of Physical Chemistry B., vol. 107, No. 51, pp. 14336-14341, 2003.
Wu et al., "Superior Radiation Resistance of $In_{1-x}Ga_xN$ Alloys: Full-Solar-Spectrum Photovoltaic Material System," Journal of Applied Physics, vol. 24, No. 10, pp. 6477-6482, Nov. 15, 2003.
Xu et al., "New Triphenylamine-Based Dyes for Dye-Sensitized Solar Cells," Journal of Physical Chemistry C, vol. 112, No. 3, pp. 874-880, 2008.
Yum et al., "Efficient Co-Sensitization of Nanocrystalline $TiO_2$ Films by Organic Sensitizers," Chemical Communications, 7 pages, printed Sep. 27, 2007.
Dennler et al., "Polymer-Fullerene Bulk-Heterojunction Solar Cells," Advanced Materials, vol. 21, pp. 1323-1338, 2009.
Kline et al., "Highly Oriented Crystals at the Buried Interface in Polythiophene Thin-Film Transistors," Nature Materials, vol. 5, pp. 222-228, Mar. 2006.
Peet et al., "Efficiency Enhancement in Low-bandgap Polymer Solar Cells by Processing with Alkane Dithiols," Nature Materials, Advance Online Publication, pp. 1-4, May 27, 2007.
Banerjee et al., "Synthesis and Characterization of Carbon Nanotube-Nanocrystal Heterostructures," Nano Letters, vol. 2, No. 3, pp. 195-200, 2002.
Clarke et al., "Photophysics of Dopamine-Modified Quantum Dots and Effects on Biological Systems," Nature Materials, vol. 5, pp. 409-417, May 2006.
Gebeyehu et al., "Hybrid Solar Cells Based on Dye-Sensitized Nanoporous $TiO_2$ Electrodes and Conjugated Polymers as Hole Transport Materials," Synthetic Metals, vol. 125, pp. 279-287, 2002.
Huang et al., "Preparation and Application of L-Cysteine-Modified CdSe/CdS Core/Shell Nanocrystals as a Novel Flourescence Probe for Detection of Nucleic Acid," Spectrochimica Acta Part A, vol. 70, pp. 318-323, 2008.
Huber et al., "The Role of Surface States in the Ultrafast Photoinduced Electron Transfer from Sensitizing Dye Molecules to Semiconductor Colloids," Journal Phys. Chemistry B, vol. 104, No. 38, pp. 8995-9003, 2000.
Landes et al., "On the Nanoparticle to Molecular Size Transition: Flourescence Quenching Studies," vol. 105, No. 43, pp. 10554-10558, 2001.
Law et al., "$ZnO-Al_2O_3$ and $ZnO-TiO_2$ Core-Shell Nanowire Dye-Sensitized Solar Cells," Journal Phys. Chemistry B, vol. 110, No. 45, pp. 22652-22663, 2006.
Leschkies et al., "Photosensitization of ZnO Nanowires with CdSe Quantum Dots for Photovoltaic Devices," Nano Letters, vol. 7, No. 6, pp. 1793-1798, 2007.
Ma et al., "A Sensitive Method for the Detection of Catecholamine Based on Fourescence Quenching of CdSe Nanocrystals," Talanta, vol. 67, pp. 979-983, 2005.
Mora-Sero et al., "Factors Determining the Photovoltaic Performance of a CdSe Quantum Dot Sensitized Solar Cell: the Role of the Linker Molecule and of the Counter Electrode," Nanotechnology, vol. 19, 7 pages, 2008.
Olson et al., "The Effect of Atmosphere and ZnO Morphology on the Performance of Hybrid Poly (3-Hexylthiophene)/ZnO Nanofiber Photovoltaic Devices," Journal Phys. Chemistry C, vol. 111, No. 44, pp. 16670-16678, 2007.
Plass et al., "Quantum Dot Sensitization of Organic-Inorganic Hybrid Solar Cells," Journal Phys. Chemistry B, vol. 106, No. 31, pp. 7578-7580, 2002.
Quintana et al., "Comparison of Dye-Sensitized ZnO and $TiO_2$ Solar Cells: Studies of Charge Transport and Carrier Lifetime," pp. 1035-1041, Journal Phys. Chemistry C, vol. 111, No. 2, pp. 1035-1041, 2007 (published on web Dec. 14, 2006).
Sharma et al., "Photoinduced Charge Transfer Between CdSe Quantum Dots and p-Phenylenediamine," Journal Phys. Chemistry B, vol. 107, No. 37, pp. 10088-10093, 2003.
Snaith et al., "Self-Organization of Nanocrystals in Polymer Brushes. Application in Heterojunction Photovoltaic Diodes," Nano Letters, vol. 5, No. 9, pp. 1653-1657, 2005.
Wu et al., "Phosphate-Modified $TiO_2$ Nanoparticles for Selective Detection of Dopamine, Levodopa, Adrenaline, and Catechol Based on Flourescence Quenching," Langmuir, vol. 23, No. 14, pp. 7880-7885, 2007.
Zhai et al., "A Simple Method to Generate Side-Chain Derivatives of Regioregular Polythiophene Via the GRIM Metathesis and Post-Polymerization Functionalization," Macromolecules, vol. 36, No. 1, pp. 61-64, 2003 (published on web Dec. 14, 2002).
U.S. Appl. No. 13/006,410 filed Jan. 13, 2011.
Rafaelle et al., "Quantum Dot—Single Wall Carbon Nanotube Complexes for Polymeric Solar Cells," IEEE, 4 pages, 2005.
Shen et al., "Photacoustic and Photoelectrochemical Characterization of CdSe-Sensitized $TiO_2$ Electrodes Composed of Nanotubes and Nanowires," Thin Solid Films, vol. 499, pp. 299-305, 2006.

* cited by examiner

SOLAR CELL WITH HYPERPOLARIZABLE ABSORBER

PRIORITY

This application claims priority to provisional application Ser. No. 61/014,908 filed Dec. 19, 2007 entitled "SOLAR CELL WITH HYPERPOLARIZABLE ABSORBER", which is incorporated herein by reference.

TECHNICAL FIELD

The disclosure relates to solar cells.

BACKGROUND

In traditional, silicon-based solar cells, silicon functions both as a source of photoelectrons as well as providing the potential barrier that is needed to separate the charges and thus form a current. In dye-sensitized solar cells, a semiconductor is used for charge separation while photoelectrons are provided by a separate dye molecule. While various types of solar cells are known, a need remains for solar cells that exhibit improved efficiency and/or improved cost effectiveness.

SUMMARY

The disclosure pertains generally to solar cells. In some instances, a solar cell may include a light sensitive layer that includes a plurality of light sensitive molecules that may, in response to incident photons, eject one or more electrons. A solar cell may, for example, include a layer that includes a plurality of hyperpolarizable molecule. Accordingly, an illustrative but non-limiting example of the disclosure may be found in a solar cell that includes a p-type electrode layer, an n-type electrode layer and a hyperpolarizable molecule layer that is disposed between the p-type electrode layer and the n-type electrode layer.

In another illustrative but non-limiting example, a solar cell may include a transparent base layer and a transparent conducting layer that is disposed on the transparent base layer. An n-type electrode layer may be disposed on the transparent conducting layer and a light sensitive layer of hyperpolarizable molecules may be disposed on the n-type electrode layer. A p-type electrode layer may be disposed on the light sensitive layer and a metal electrode layer may be disposed on the p-type electrode layer.

In another illustrative but non-limiting example, the disclosure relates to a solar cell that includes a p-type electrode, an n-type electrode and a plurality of hyperpolarizable molecules disposed between the p-type electrode and the n-type electrode. At least some of the hyperpolarizable molecules may each include an electron donating group that is bonded or otherwise linked to the n-type electrode as well as an electron accepting group that is bonded or otherwise linked to the p-type electrode. In some instances, at least some of the hyperpolarizable molecules may each include an electron accepting group that is bonded or otherwise linked to the n-type electrode as well as an electron donating group that is bonded or otherwise linked to the p-type electrode.

The above summary is not intended to describe each disclosed embodiment or every implementation of the disclosure. The Figures and Detailed Description which follow more particularly exemplify these embodiments.

BRIEF DESCRIPTION OF THE FIGURES

The following description should be read with reference to the drawings, in which like elements in different drawings are numbered in like fashion. The drawings, which are not necessarily to scale, depict selected embodiments and are not intended to limit the scope of the disclosure. The disclosure may be more completely understood in consideration of the following detailed description of various embodiments in connection with the accompanying drawings, in which.

Figure 1:
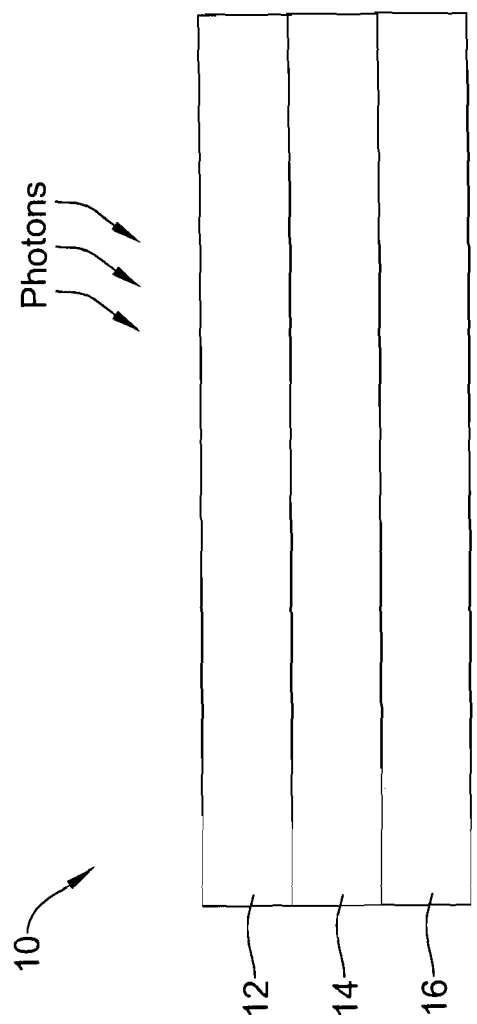
FIG. 1 is a schematic view of an illustrative but non-limiting example of a solar cell.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The following description should be read with reference to the drawings, in which like elements in different drawings are numbered in like fashion. The drawings, which are not necessarily to scale, depict selected embodiments and are not intended to limit the scope of the disclosure. Although examples of construction, dimensions, and materials are illustrated for the various elements, those skilled in the art will recognize that many of the examples provided have suitable alternatives that may be utilized.

FIG. 1 is a schematic illustration of a solar cell 10. As illustrated, solar cell 10 is spatially aligned such that incident photons approach solar cell 10 from above. It will be recognized that this spatial arrangement is merely illustrative, as solar cell 10 is operable independently of whether solar cell 10 is horizontally disposed, vertically disposed, or the like. What is useful is that solar cell 10 be arranged in alignment or at least substantially in alignment with incident photons.

Solar cell 10 may include an n-type electrode layer 12. In some cases, the n-type electrode layer 12 may be a doped or undoped polymer or a metal. In the illustrated configuration, n-type electrode layer 12 may be considered as being transparent or at least substantially transparent to at least some portions of the electromagnetic spectrum. In some instances, n-type electrode layer 12 may be considered as being transparent or at least substantially transparent to at least some wavelengths of visible light. For example, transparency may be defined as permitting at least 75 percent or more of incident light of a particular wavelength or group of wavelengths to pass therethrough. In particular instances, n-type electrode layer 12 may be formed from or include titanium dioxide.

Solar cell 10 may include a light sensitive layer 14. Light sensitive layer 14 may include a plurality of hyperpolarizable molecules. In some cases, at least some of the one or more hyperpolarizable molecules within light sensitive layer 14 may, as will be discussed further below, include an electron donating group that may, upon light-induced excitation, give up an electron to n-type electrode layer 12. While suitable hyperpolarizable molecules are generally discussed below, it should be noted that exemplary hyperpolarizable molecules for use within light sensitive layer 14 may include:

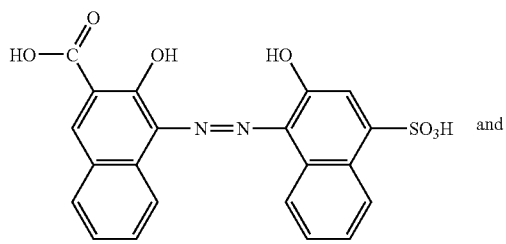

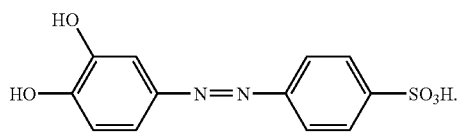

Solar cell 10 may also include a p-type electrode layer 16. As discussed above, p-type electrode layer 16 may be formed of a variety of different materials including polymeric and/or metallic materials as well as electrolytes. In some instances, p-type electrode layer 16 may be formed of a material such as a doped or protonated polymer that can provide an electron to at least one of the one or more hyperpolarizable molecules. In particular instances, p-type electrode layer may include or be formed from doped emeraldine base, as further discussed below.

In some cases, the hyperpolarizable molecule or molecules may protonate a nitrogen to provide a positive charge on the polymer. In some instances, p-type electrode layer 16 may be formed of a polymer that is not protonated by the hyperpolarizable molecule or molecules. In some cases, p-type electrode layer 16 may instead include or be formed from polymers such as P3HT, or poly(3-hexyl thiophene), poly[3-(ω-mercapto hexyl)]thiophene, poly[3-(ω-mercapto undecyl)]thiophene, poly[3-(ω-mercapto dodecyl)]thiophene, MEH-PPV, or poly[2,5-dimethoxy-1,4-phenylene-1,2-ethenylene, 2-methoxy-5-2-ethylhexyloxy-1,4-phenylene-1,2-ethylene), PPP, or poly(p-phenylene), TFB, or poly(9,9-dioctylfluorene-co-N-(4-(3-methylpropyl)-diphenylamine), and the like.

In some cases, the hyperpolarizable molecule or molecules may be covalently linked to the polymer backbone, as shown below. It can be seen that the carboxylic acid moiety is covalently bonded to the n-type electrode (shown as titanium dioxide) while the other end of the molecule is covalently bonded to the p-type polymer.

where $R_6$ may be CN, COOH, COOR, $CONR_2$, or $CONHR_2$, and $R_7$ may be OH, OR, OCOR, $NH_2$, NHR, or $NR_2$, R is an alkyl, and n is an integer ranging from 1 to 5.

Figure 2:
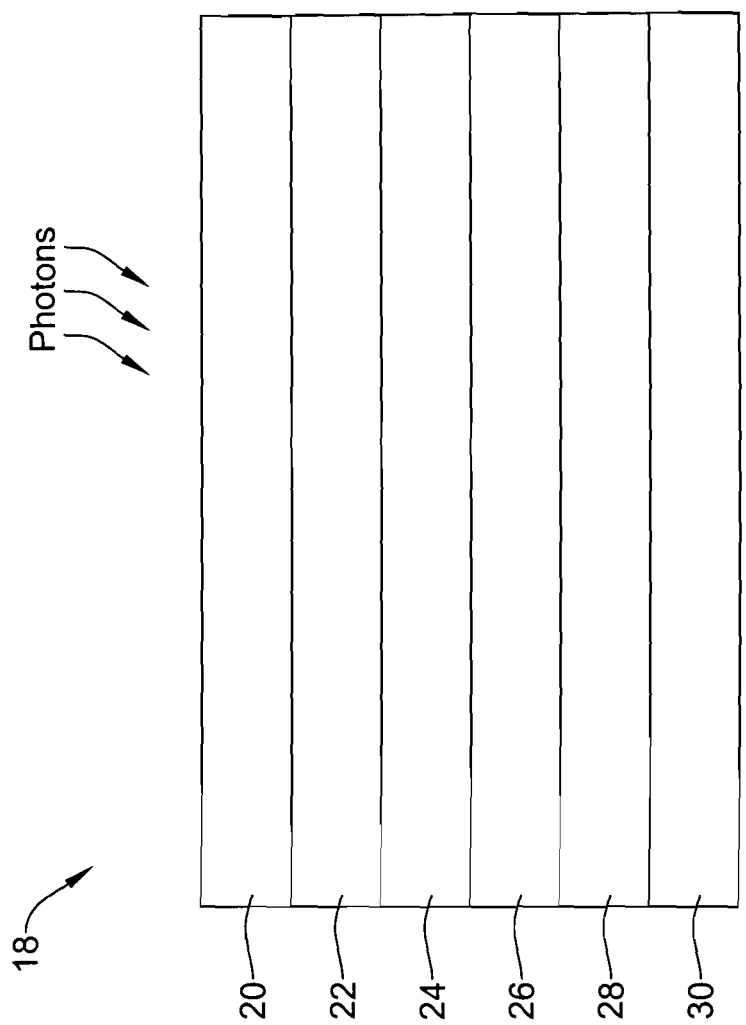
FIG. 2 is a schematic view of another illustrative but non-limiting example of a solar cell.

FIG. 2 is a schematic view of a solar cell 18. As illustrated, solar cell 18 is spatially aligned such that incident photons approach solar cell 18 from above. It will be recognized that this spatial arrangement is merely illustrative, as solar cell 18 is operable independently of whether solar cell 18 is horizontally disposed, vertically disposed, or the like. What is useful is that solar cell 18 be arranged in alignment or at least substantially in alignment with incident photons.

Solar cell 18 may include a transparent base layer 20. In some instances, transparent base layer 20 may be considered as a base or substrate upon which solar cell 18 is constructed, even though, in use, transparent base layer 20 may be the portion of solar cell 18 that is arranged in alignment with incident photons. Transparent base layer 20 may be formed of any suitable material that is transparent or at least substantially transparent to at least some wavelengths of the electromagnetic spectrum. In some cases, transparent base layer 20 may include or be formed from glass.

A transparent conducting layer 22 may be formed on or otherwise disposed adjacent to transparent base layer 18. Transparent conducting layer 22 may be formed of any suitable material or materials. In some instances, transparent conducting layer 22 may include or be formed from a transparent conducting oxide. Examples of suitable transparent conducting oxides include but are not limited to ZnO, $In_2O_3$ and $SnO_2$. Transparent conducting layer 22 may be formed using any suitable technique, such as printing, screen printing, vapor deposition and the like.

An n-type electrode layer 24 may be formed on or otherwise disposed adjacent to transparent conducting layer 22. Any suitable material may be used to form n-type electrode layer 24, including metals and doped or undoped polymers. In some instances, n-type electrode layer 24 may be transparent or at least substantially transparent to at least some wavelengths of light within the visible portion of the electromagnetic spectrum. In particular instances, n-type electrode layer 24 may include or be formed from titanium dioxide.

Solar cell 18 may include a light sensitive layer 26 that includes one or more hyperpolarizable molecules, and may be formed via various methods including functionalization or may otherwise disposed adjacent to n-type electrode layer 24. In some cases, at least some of the one or more hyperpolarizable molecules within light sensitive layer 26 may, as discussed above, upon light-induced excitation, give up an electron to n-type electrode layer 24. While suitable hyperpolarizable molecules are generally discussed above, it should be noted that exemplary hyperpolarizable molecules for use within light sensitive layer 26 can include

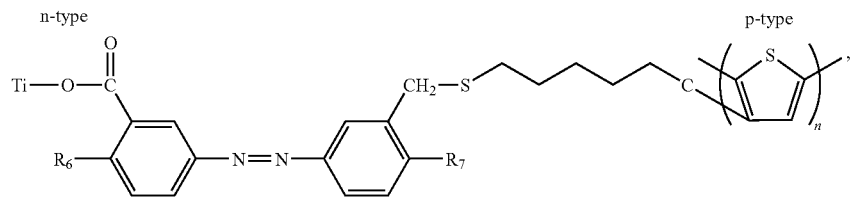

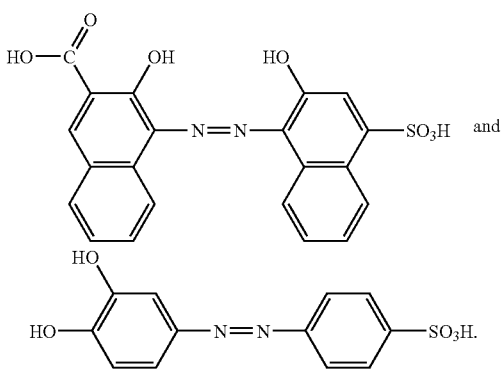

Solar cell 18 may also include a p-type electrode layer 28 that is formed or otherwise disposed adjacent to light sensitive layer 26. As discussed above, p-type electrode layer 28 may be formed of a variety of different materials. In some instances, p-type electrode layer 28 may be formed of a material such as a doped or protonated polymer that can provide an electron to at least one of the one or more hyperpolarizable molecules. In particular instances, p-type electrode layer may include or be formed from doped emeraldine base. Solar cell 18 may include a metal electrode layer 30 that is formed or otherwise disposed adjacent to p-type electrode layer 28. Metal electrode layer 30 may be formed of any suitable metal using any suitable technique. Examples of suitable metals include but are not limited to copper, silver, gold and the like.

Light sensitive layer 14 (FIG. 1) and light sensitive layer 26 (FIG. 2) may, as noted above, be formed from or otherwise include a plurality of hyperpolarizable molecules. In some instances, a hyperpolarizable molecule may be considered as including an electron donating group and an electron withdrawing group. Suitable electron withdrawing groups include but are not limited to $NO_2$, CN, $CONR_2$, $CONH_2$, COOH, COOR, $SO_2R$, $SO_2OR$, NO, aryl and the like, where R is alkyl. Suitable electron donating groups include but are not limited to $O^-$, $NR_2$, NHR, $NH_2$, NHCOR, OH, F, Cl, Br, I, SH, SR, OR, OH and the like, where R is alkyl.

The electron donating group and the electron withdrawing group may be connected by a bridge containing a chromophore. Examples of chromophores include, but are not limited to, stilbene chromophore, ethylene chromophore, carbonyl chromophore, azo chromophores, and the like. In some cases, therefore, the electrons can be considered as being delocalized as a result of the electron flow between the electron donor group and the electron acceptor group being separated by the bridge. It is noted that hyperpolarizable molecules can be useful in a solar cell because they can eject electrons into a conduction band in response to incident light.

In some cases, the hyperpolarizable molecule may be configured or selected having a LUMO (Lowest Unoccupied Molecular Orbital) state that maximizes the electron transfer rate from the hyperpolarizable molecule to the n-type electrode. In some instances, for example, if the electron transfer is following the Marcus transfer theory, the band offset between molecular LUMO and the bottom of the electrode conduction band may be around the reorganization energy to get maximum electron transfer rate. Similarly, for a particular hyperpolarizable molecule, the electrode conduction band may be chosen to maximize the electron transfer rate.

For example, electrons within a hyperpolarizable molecule may be excited by incident photons at an energy level that permits the electrons to move to a conductor. Subsequent to electron transfer, the hyperpolarizable molecule may accept an electron from another source. In some cases, the electron donor group portion of the hyperpolarizable molecule may be covalently or otherwise bound or linked to an n-type electrode while the electron acceptor group portion of the hyperpolarizable molecule may be covalently or ionically bound to a p-type electrode that can provide an electron to the hyperpolarizable molecule once the hyperpolarizable molecule has given up an electron to the n-type electrode.

In some instances, the acceptor group portion of the hyperpolarizable molecule may be covalently or otherwise bound or linked to an n-type electrode while the electron donor group portion of the hyperpolarizable molecule may be covalently or ionically bound to a p-type electrode that can provide an electron to the hyperpolarizable molecule once the hyperpolarizable molecule has given up an electron to the n-type electrode.

In some instances, the hyperpolarizable molecule may be covalently bonded or otherwise linked or bound to an n-type electrode. In some cases, the hyperpolarizable molecule may include a carboxylic group that can link to the n-type electrode. A second end of the hyperpolarizable molecule may be linked through ionic bonding or covalent bonding to a polymer or another material that is capable of donating electrons to the hyperpolarizable molecule. In some instances, the polymer that provides electrons to the hyperpolarizable molecule (reduces the hyperpolarizable molecule) may have an ionization potential that is between the HOMO (Highest Occupied Molecular Orbitals) and the LUMO of the hyperpolarizable molecule and below the position of the conduction band of the n-type electrode.

In some cases, the hyperpolarizable molecule may be considered as being a molecule that has particular characteristics. For example, in some cases, a hyperpolarizable molecule may be a plane and conjugated molecule that has both electron donating atoms or groups of atoms as well as electron withdrawing atoms or groups of atoms. In some instances, a hyperpolarizable molecule may include a chromophoric group that is able to absorb light of a desired wavelength or range of wavelengths and subsequently eject an excited electron. In some cases, the chromophoric group may be configured to absorb light within at least part of the visible portion of the electromagnetic spectrum.

In some cases, a hyperpolarizable molecule may include an anchoring group that may covalently or otherwise bind to a surface of the n-type electrode. In particular instances, the anchoring group may be or include a carboxyl group or hydroxyl and carboxyl group that are in the ortho position (chelate formation). The hyperpolarizable molecule may include a group that covalently or ionically bonds to the p-type electrode.

A variety of hyperpolarizable molecules are contemplated. For example, a suitable hyperpolarizable molecule may have the following structure:

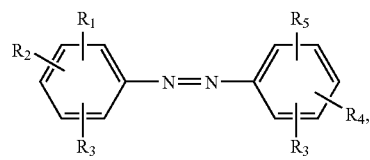

where $R_1$ and $R_2$ are each independently carboxyl or hydroxyl, $R_3$ is absent or a conjugated ring structure, $R_4$ is an acidic group, and $R_5$ may, for example, be absent or a hydroxyl group. In some cases, $R_1$ and $R_2$ are both hydroxyl. In some cases, $R_1$ may be carboxyl while $R_2$ may be hydroxyl. In some cases, $R_3$ represents a benzene group, a naphthalene group, or a similar conjugated ring structure. In some instances, $R_3$ may be absent. In some instances, $R_4$ may be any suitable acid group, including any acid group that may be able to protonate a polymer to provide a p-type electrode. In some cases, $R_4$ may, for example, be a sulfonic acid moiety, a phosphonic acid moiety or a carboxyl moiety.

In some instances, a suitable hyperpolarizable molecule containing an azo chromophore may have the following structure:

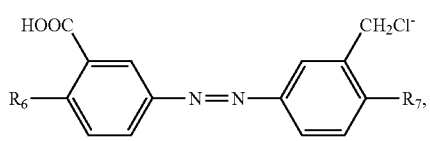

where $R_6$ may be CN, COOH, COOR, $CONR_2$, or $CONHR_2$, and $R_7$ may be OH, OR, OCOR, $NH_2$, NHR, or $NR_2$, and R is alkyl.

Another suitable hyperpolarizable molecule containing a stilbene chromophore (n=1) or a polyenic chromophore (n>2) may have the following structure:

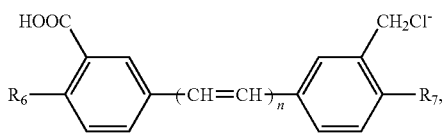

where $R_6$ may be CN, COOH, COOR, $CONR_2$, or $CONHR_2$, and $R_7$ may be OH, OR, OCOR, $NH_2$, NHR, or $NR_2$, R is alkyl, and n is an integer ranging from 1 to 5.

Illustrative but non-limiting examples of exemplary hyperpolarizable molecules include calcon carboxylic acid, which is shown below:

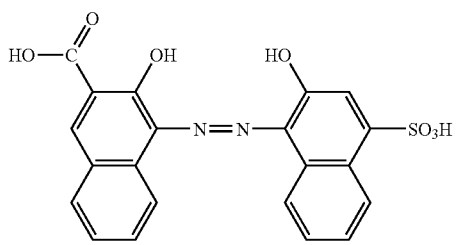 [SMILES: O=C(O)c1cc2ccccc2c(N=Nc2c(O)cc(S(=O)(=O)O)c3ccccc23)c1O]

Another exemplary hyperpolarizable molecule is p-[(3,4-dihydroxy)phenylazo]benzenesulfonic acid, the chemical structure of which is shown below:

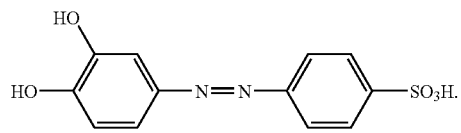 [SMILES: O=S(=O)(O)c1ccc(N=Nc2ccc(O)c(O)c2)cc1]

An illustrative but non-limiting p-type electrode is emeraldine base, which may be doped via a strongly acidic group of a hyperpolarizable molecule. Emeraldine base is an insulating form of polyaniline. In some instances, a strongly acidic group such as a sulfonic acid group may protonate, or otherwise dope, the emeraldine base. The chemical structure of emeraldine base is shown below:

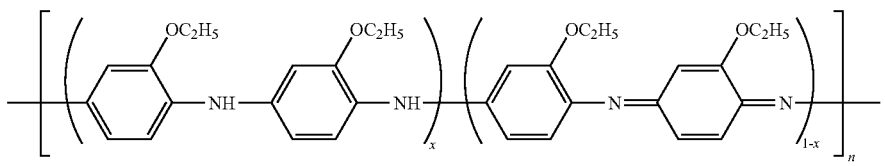

In some cases, emeraldine base may be synthesized by an oxidation reaction using, for example, ammonium peroxidisulphate or hydrogen peroxide, with 2-ethoxy aniline as the monomer. In order to synthesize the p-type semiconducting polymer, the emeraldine base can be doped by protonation. Sulfonic groups, which are responsible for the protonation of imine nitrogen atom, are found in both calcon carboxylic acid and p-[(3,4 dihidroxy) phenylazo]benzenesulfonic acid.

In some cases, the n-type electrode may be $TiO_2$. Calcon carboxylic acid may, for example, covalently bond to $TiO_2$ via its hydroxyl and carboxyl groups. With respect to p-[(3,4 dihydroxy) phenylazo]benzenesulfonic acid, this molecule may covalently bond to $TiO_2$ via its hydroxyl groups. As seen above, these specific illustrative but non-limiting examples of hyperpolarizable molecules possess a sulfonic acid group that dopes (protonates) the emeraldine base.

The following contemplative examples further illustrate the disclosure. These examples are not be construed as limiting the invention in any way.

Example 1

It is contemplated that the emeraldine base may be synthesized through oxidation of 2-ethoxy aniline with hydrogen peroxide as the oxidant. For example, 2-ethoxy aniline hydrochloride (15 g,) may be dissolved in 350 mL of distilled water. The reaction mixture may be mechanically stirred in an ice bath for one hour. After adding 60 mL of ammonium hydrogen peroxide, the chemical polymerization of 2-ethoxy aniline may be initiated. After this, the solution may be put in a refrigerator, at 4 degree Celsius, for five hours. An excess of 2M sodium hydroxide solution may be added in order to dedope the synthesized emeraldine. Two grams of the emeraldine base may be dissolved in 100 mL of water and the dopant (calcon carboxylic acid) may be added. The mixture may be sonicated in an ultrasonic bath for 6 hours. The crude emeraldine salt may be washed with 100 mL of water in two portions.

A glass substrate may be provided. TiO$_2$ nanoparticles (in the anatase phase) may be deposited onto the glass substrate and sinterized at a temperature of 473° C. The resultant structure may be dipped into a solution of dimethyl formamide, doped polyaniline and calcon carboxylic acid. The resulting structure may be TiO$_2$/calconcarboxylic acid/polyaniline, as shown below. It will be appreciated that in the structure shown, the titanium dioxide may be deposited on the surface of the glass substrate:

the dopant (p-[(3,4 dihidroxy) phenylazo]benzenesulfonic acid) may be added. The mixture may be sonicated in an ultrasonic bath for 6 hours. The crude emeraldine salt may be washed with 100 mL of water in two portions.

A glass substrate may be provided. TiO$_2$ nanoparticles (in the anatase phase) may be deposited onto the glass substrate and sinterized at a temperature of 473° C. The resultant structure may be dipped into a solution of dimethyl formamide, doped polyaniline and p-[(3,4 dihidroxy) phenylazo]benze-

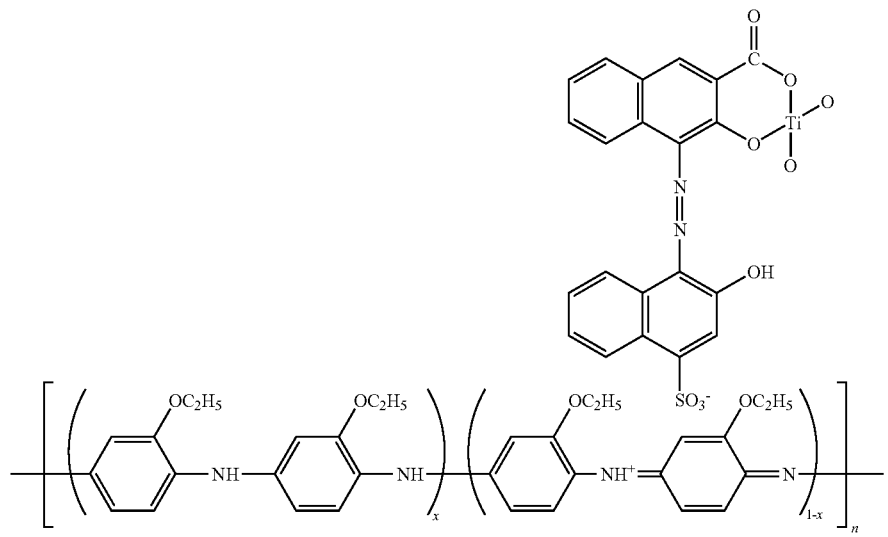

Example 2

It is contemplated that the emeraldine base may be synthesized as discussed with respect to Example 1. Two grams of the emeraldine base may be dissolved in 100 mL of water and nesulfonic acid. The resulting structure may be TiO$_2$/p-[(3,4 dihidroxy) phenylazo]benzenesulfonic acid/polyaniline, as shown below. It will be appreciated that in the structure shown, the titanium dioxide may be deposited on the surface of the glass substrate:

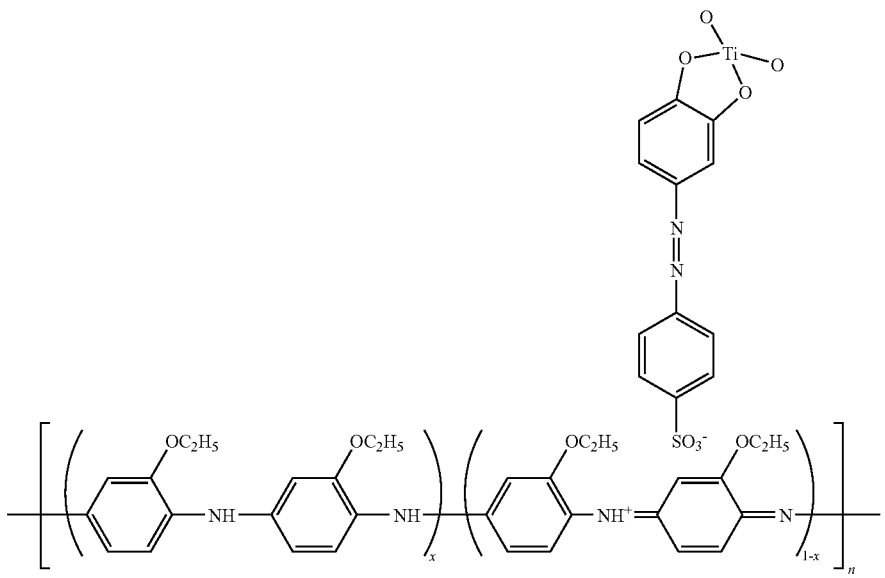

The disclosure should not be considered limited to the particular examples described above, but rather should be understood to cover all aspects of the invention as set out in the attached claims. Various modifications, equivalent processes, as well as numerous structures to which the invention can be applicable will be readily apparent to those of skill in the art upon review of the instant specification.

What is claimed is:

1. A solar cell comprising:
   a p-type electrode;
   an n-type electrode;
   a plurality of hyperpolarizable molecules disposed between the p-type electrode and the n-type electrode, at least some of the plurality of hyperpolarizable molecules each comprising an electron donating group that is linked to the n-type electrode and an electron accepting group that is linked to the p-type electrode; and
   wherein at least some of the hyperpolarizable molecules comprise:

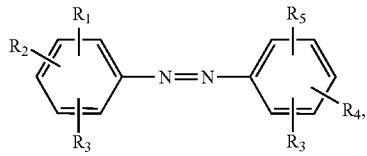

where $R_1$ and $R_2$ are each independently carboxyl or hydroxyl, $R_3$ is absent or a conjugated ring structure, $R_4$ is an acidic group, and $R_5$ is absent or hydroxyl.

2. A solar cell comprising:
   a p-type electrode;
   an n-type electrode;
   a plurality of hyperpolarizable molecules disposed between the p-type electrode and the n-type electrode, at least some of the plurality of hyperpolarizable molecules each comprising an electron donating group that is linked to the n-type electrode and an electron accepting group that is linked to the p-type electrode; and
   wherein at least some of the hyperpolarizable molecules comprise:

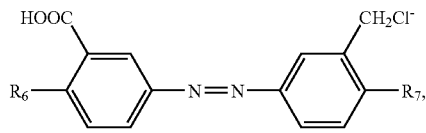

where $R_6$ may be CN, COOH, COOR, $CONR_2$, or $CONHR_2$, and $R_7$ may be OH, OR, OCOR, $NH_2$, NHR, or $NR_2$, and R is alkyl.

3. A solar cell comprising:
   a p-type electrode;
   an n-type electrode;
   a plurality of hyperpolarizable molecules disposed between the p-type electrode and the n-type electrode, at least some of the plurality of hyperpolarizable molecules each comprising an electron donating group that is linked to the n-type electrode and an electron accepting group that is linked to the p-type electrode; and
   wherein at least some of the hyperpolarizable molecules comprise:

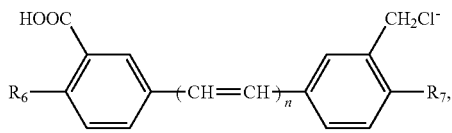

where $R_6$ may be CN, COOH, COOR, $CONR_2$, or $CONHR_2$, and $R_7$ may be OH, OR, OCOR, $NH_2$, NHR, or $NR_2$, R is alkyl, and n is an integer ranging from 1 to 5.

4. A solar cell comprising:
   a p-type electrode;
   an n-type electrode;
   a plurality of hyperpolarizable molecules disposed between the p-type electrode and the n-type electrode, at least some of the plurality of hyperpolarizable molecules each comprising an electron donating group that is linked to the n-type electrode and an electron accepting group that is linked to the p-type electrode; and
   wherein at least some of the hyperpolarizable molecules comprise:

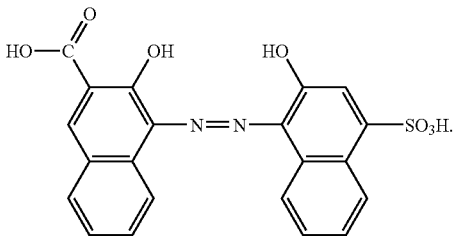 [SMILES: O=C(O)c1cc2ccccc2c(N=Nc2c(O)cc(S(=O)(=O)O)c3ccccc23)c1O]

5. A solar cell comprising:
   a p-type electrode;
   an n-type electrode;
   a plurality of hyperpolarizable molecules disposed between the p-type electrode and the n-type electrode, at least some of the plurality of hyperpolarizable molecules each comprising an electron donating group that is linked to the n-type electrode and an electron accepting group that is linked to the p-type electrode; and
   wherein at least some of the hyperpolarizable molecules comprise:

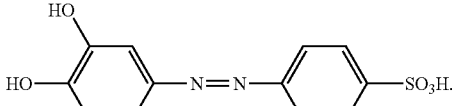

* * * * *